United States Patent
Yamazaki et al.

[11] Patent Number: 5,870,489
[45] Date of Patent: Feb. 9, 1999

[54] BALL DETECTION METHOD AND APPARATUS FOR WIRE-BONDED PARTS

[75] Inventors: Nobuto Yamazaki; Yoshiyuki Ogata, both of Tokyo, Japan

[73] Assignee: Kabushiki Kaisha Shinkawa, Tokyo, Japan

[21] Appl. No.: 910,679

[22] Filed: Aug. 13, 1997

Related U.S. Application Data

[63] Continuation of Ser. No. 484,637, Jun. 7, 1995, abandoned.

[30] Foreign Application Priority Data

Jul. 16, 1994 [JP] Japan .................................. 6-186507

[51] Int. Cl.⁶ ...................................................... G06K 9/00
[52] U.S. Cl. ............................ 382/151; 382/150; 228/105
[58] Field of Search ..................................... 382/149, 150, 382/151; 228/102, 103, 105

[56] References Cited

U.S. PATENT DOCUMENTS

| | | | |
|---|---|---|---|
| 5,189,711 | 2/1993 | Weiss et al. | 382/203 |
| 5,456,403 | 10/1995 | Nishimaki et al. | 228/102 |
| 5,459,794 | 10/1995 | Ninomiya et al. | 382/145 |
| 5,550,763 | 8/1996 | Michael et al. | 382/145 |
| 5,579,984 | 12/1996 | Sasano | 348/95 |
| 5,581,632 | 12/1996 | Koljonen | 382/168 |
| 5,592,562 | 1/1997 | Rooks | 382/150 |

FOREIGN PATENT DOCUMENTS

| | | | |
|---|---|---|---|
| 51-78174 | 7/1976 | Japan | H01L 21/607 |
| 57-50059 | 10/1982 | Japan | H01L 21/60 |
| 4-317342 | 11/1992 | Japan | H01L 21/60 |
| 4-320350 | 11/1992 | Japan | H01L 21/60 |
| 5-206197 | 8/1993 | Japan | H01L 21/60 |

*Primary Examiner*—Amelia Au
*Assistant Examiner*—Jingge Wu
*Attorney, Agent, or Firm*—Koda & Androlia

[57] ABSTRACT

A method and apparatus for determining the position, size and/or shape of a ball formed on a pad of a semiconductor chip when a wire is bonded between the pad and a lead of a lead frame. The ball is detected in at least three directions from the center of the ball towards the edge of the ball.

3 Claims, 6 Drawing Sheets

PRIOR ART

FIG. 7
PRIOR ART

BALL DETECTION METHOD AND APPARATUS FOR WIRE-BONDED PARTS

This application is a continuation of application Ser. No. 08/484,637, filed Jun. 7, 1995, now abandoned.

BACKGROUND OF THE INVENTION

1. Field of the Invention

The present invention relates to a ball detection method and apparatus for wire-bonded points and more particularly to a method and apparatus for detecting balls after the ball bonding operations.

2. Prior Art

Figure 3:
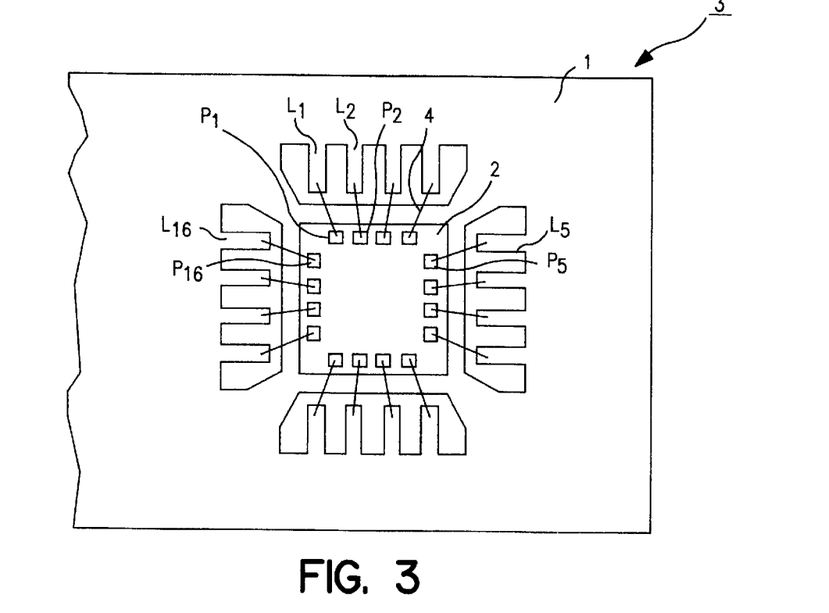
FIG. 3 is a top view showing one example of a workpiece.
Figure 4:
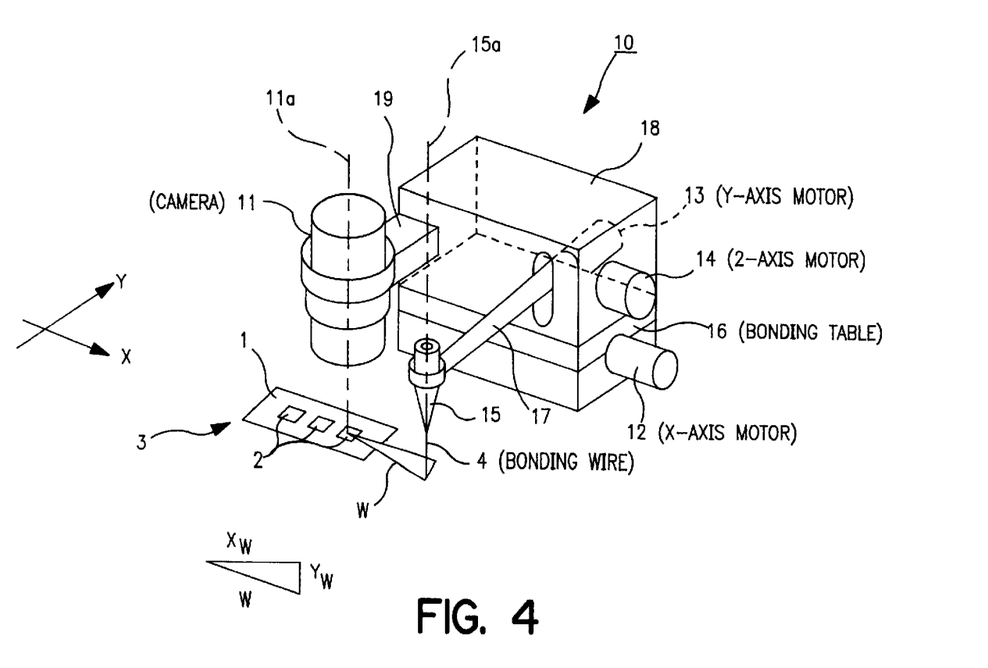
FIG. 4 is a perspective view illustrating one example of a wire bonding apparatus.

As shown in FIG. 4, in a workpiece 3 which comprises a semiconductor chip 2 installed on a lead frame 1, wires 4 are used for connecting the pads $P_1$, $P_2$ . . . of a semiconductor chip 2 and the leads $L_1$, $L_2$ . . . of a lead frame 1. The connection between the pads and the leads are done by a wire bonding apparatus as shown, for example, in FIG. 3.

Generally, in wire bonding executed between the pads and leads, any positional shift or discrepancy between them from predetermined positions is first detected at at least two points on the semiconductor chip 2 and at least two points on the lead frame 1 by a camera 11, and then the bonding coordinates for the pads and leads stored beforehand in the bonding apparatus are corrected based upon the detected result.

When the detection of the positional shift is performed by the camera 11, an X-axis motor 12 and Y-axis motor 13 are first driven so that the central axis 11a of the camera 11 is moved directly above each measuring point. After the bonding coordinates are corrected as described above, the capillary 15, through which a bonding wire 4 passes, is moved in the X and Y directions, or horizontally, and in the Z direction, or vertically, and the wire 4 is bonded between the pads $P_1$, $P_2$ . . . of the semiconductor chip 2 and the leads $L_1$, $L_2$ . . . of the lead frame 1.

In the process described above, the central axis 11a of the camera 11 and the central axis 15a of the capillary 15 are positionally offset by a distance W. Accordingly, after the positional shifts of points to be bonded have been detected by the camera 11 and the bonding coordinates have been corrected, an XY table or the bonding table 16 that has the capillary 15 is moved horizontally the offset distance W by the X-axis motor 12 and Y-axis motor 13 so as to bring the capillary 15 above a first bonding point. Then, the wire 4 is bonded at the point of corrected bonding coordinates by moving the XY table in the X, Y and Z directions by the X-, Y- and Z-axis motors by adjusting (or raising and lowering) the capillary arm 17 (or causing the capillary arm 17 to pivot).

In FIG. 4, the capillary arm 17 is pivotally mounted to a bonding head 10, and the camera 11 is fixed to the bonding head 10 via a camera-holding arm. In this Figure, Xw represents the X-axis component of the offset distance W, and Yw represents the Y-axis component of the offset distance W.

The devices disclosed in Japanese Patent Application Laid-Open (Kokai) Nos. 4-317342 and 4-320350 are prior art examples of wire bonding apparatuses of the type described above. The methods disclosed in Japanese Patent Application Laid-Open (Kokai) No. 51-78174 and Japanese Patent Application Publication (Kokoku) No. 57-50059 are prior art examples of methods for correcting the positions of workpieces.

As seen from the above, a mechanically determined fixed offset distance W exists between the central axis 11a of the camera 11 and the central axis 15a of the capillary 15. Accordingly, bonding can only be accurately performed at bonding points by detecting via the camera 11 the amount of positional shift of each workpiece 3, correcting the bonding coordinates, and then moving the capillary 15 (in accordance with a predetermined program) a distance that corresponds to the offset distance so that the capillary 15 is positioned at the corrected bonding coordinates.

However, wire bonding apparatuses generally include a heating block for heating lead frames, and they also include a capillary arm which holds the capillary. In addition to the heating block, other heat-generating sources such as X- and Y-axis motors and an ultrasonic oscillation source which is installed inside the capillary arm are used in wire bonding apparatuses. A Z-axis motor which raises and lowers or pivots a capillary arm is another element used in the bonding apparatuses.

Due to the operating heat and variations in the ambient temperature caused by the heat-generating sources as described above, differences between the thermal expansion of the capillary arm and the thermal expansion of the camera-holding arm that holds the camera are created. As a result, the offset distance between the central axis of the camera and the central axis of the capillary tends to change with respect to both amount and direction, and error caused by this fluctuation results in a shift in the bonding position.

The detection of the shift in the bonding position is generally accomplished by the imaging device 11 that detects the position of the center of the ball bonded to the pad P.

The method described in Japanese Patent Application Laid-Open (Kokai) No. 5-206197 is one of the conventional methods for detecting the position of the center of the ball. This method will be described with reference to FIGS. 5 through 7.

Figure 5:
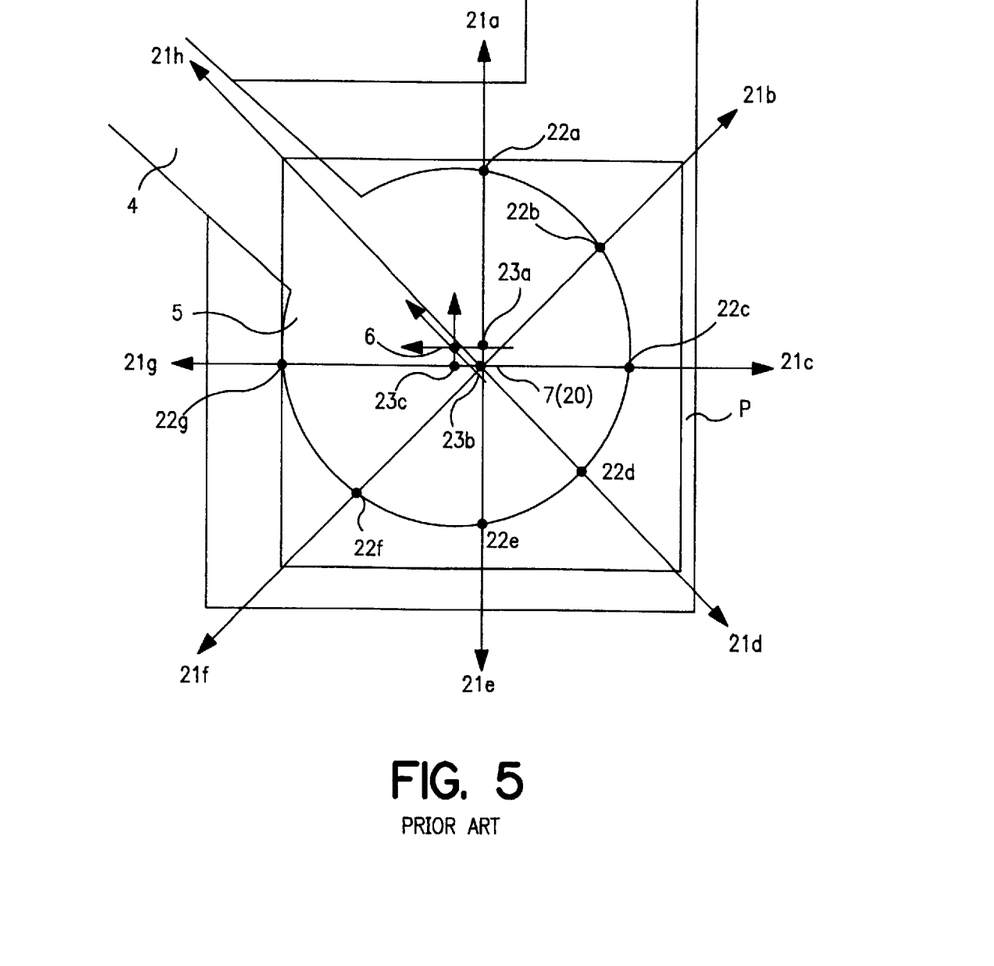
FIG. 5 is an explanatory diagram illustrating one example of a conventional method for detecting the center position of a wire-bonded part.
Figure 6:
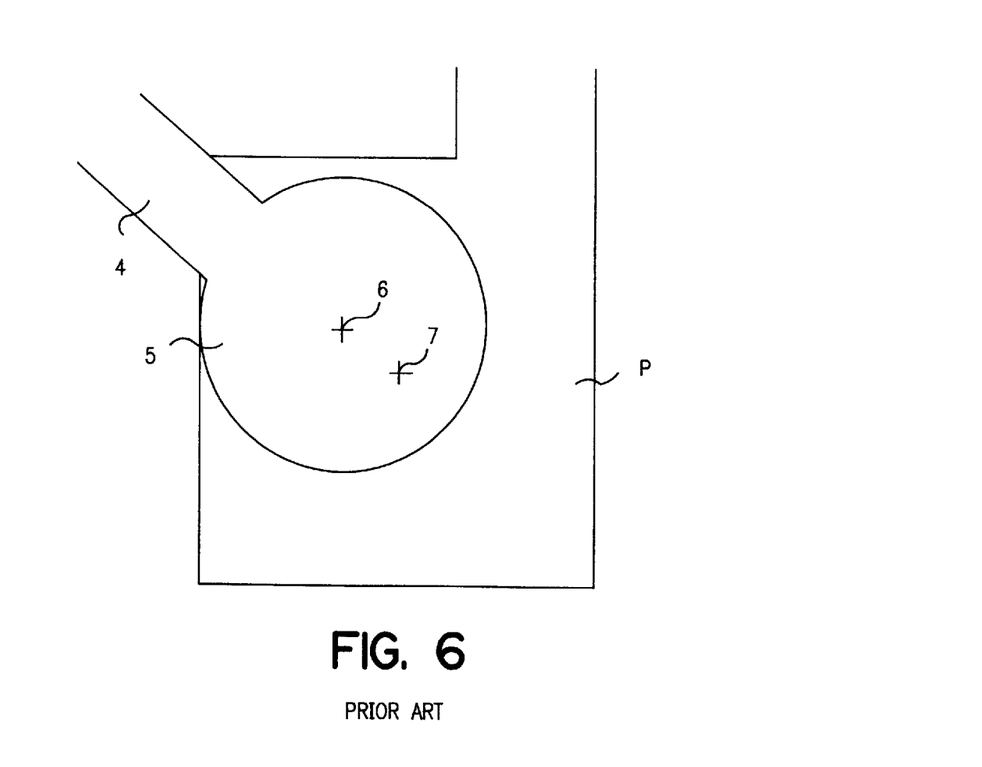
FIG. 6 is a partially enlarged view of the image of a wire-bonded part obtained in a case where the center of the ball is greatly shifted from the center of the pad.
Figure 7:
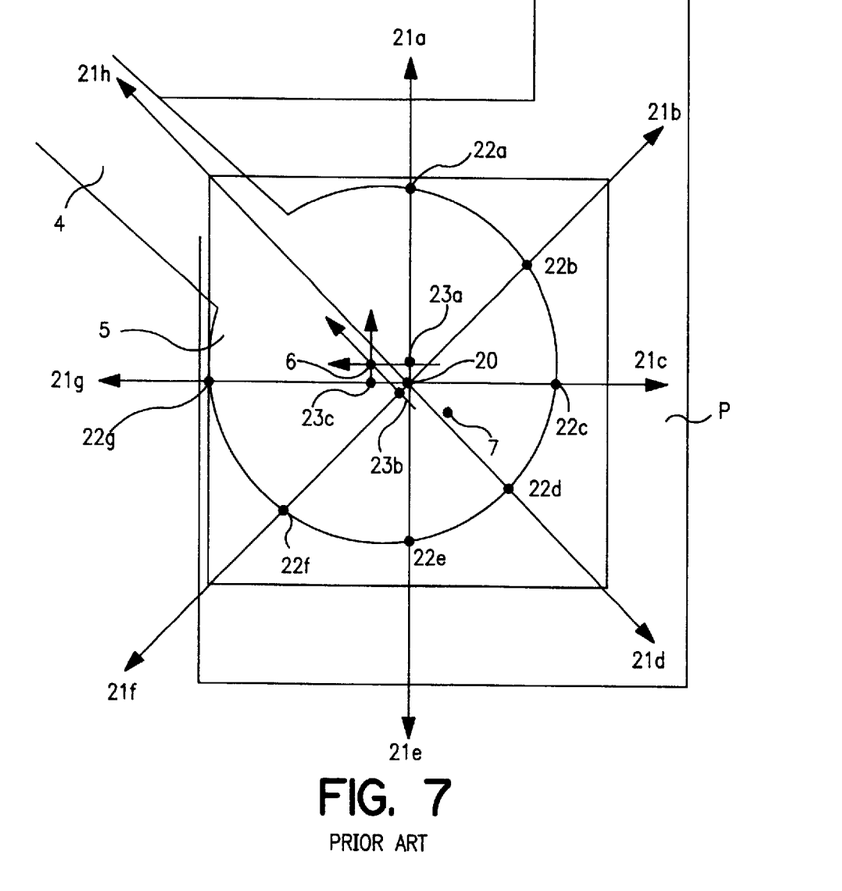
FIG. 7 is an explanatory diagram which illustrates the method for detecting the center position of the wire-bonded part of FIG. 6.

FIG. 5 shows that the center 7 of the pad P and the center 6 of the ball 5 bonded to the pad P substantially coincide, while FIGS. 6 and 7 illustrate a case where the center 5 of the ball 6 is shifted considerably from the center 7 of the pad P and not coincide.

In the method of this prior art, when ascertaining the approximate position of the ball 5, a macro-recognition process that uses two-value pattern matching is first performed to detect a tentative ball center 20. Using this tentative ball center 20 as a reference point, an edge search is next performed in eight directions 21a through 21h, so that multi-value edges 22a through 22h of the ball 5 are detected. Then, these detected ball edges are divided into four sets, i.e., 22a–22e, 22b–22f, 22c–22g and 22d–22h, and the respective center coordinates (intermediate positions) 23a, 23b, 23c and 23d are calculated or obtained. After this, perpendicular lines are drawn from the center coordinates 23a, 23b, 23c and 23d, and the center-of-gravity coordinates of the ball 5, i.e., the center coordinates 6 of the ball 5, are determined from the coordinates of the respective points of intersection.

As seen from the above, in the prior art described above, the tentative ball center 20 is set by subjecting the ball 5 to a two-value conversion, and edge searches are performed in eight different directions using this tentative ball center 20 as a reference point. As a result, several problems arise. The illuminating optical system is generally set so that the ball 5 and wire 4 are dark and pad P is bright; however, the area inside the ball 5 is not evenly dark but instead shows an irregular brightness. As a result, locations which are in fact no the edges of the ball are detected in error as ball edges.

In addition, in the prior art method described above, it is necessary to calculate the center coordinates 23a, 23b, 23c and 23d of all of the ball edge combinations 22a–22e, 22b–22f, 22c–22g and 22d–22h that pass through the tentative ball center 20. Accordingly, another problem arises. If the center 6 of the ball 5 and the center 7 of the pad P roughly coincide as shown in FIG. 5, the edges of the pad P and the edges of the ball 5 are separated from each other and can be clearly distinguished so that the center coordinates 23a, 23b and 23c are calculated. Thus, there is no problem. However, if the center 6 of the ball 5 is greatly shifted from the center 7 of the pad P so that the image of the ball 5 overlaps with the edges of the pad P or comes very close to the edges of the pad P as shown in FIGS. 6 and 7, the pattern surrounding the ball edges 22a and 22g are detected. This results in erroneous detections. Accordingly, in such cases, the center coordinates 23a of the edge combination 22a–22e and the center coordinates 23c of the edge combination 22c–22g are detected in error, and the result is that the center coordinates 6 of the ball 5 are not accurate.

Furthermore, in the prior art method, the ball edges 22a through 22h are first detected, the center points of the respective ball edge combinations are next determined, perpendicular lines are drawn from the center points, and then the center coordinates 6 of the ball are determined from the coordinates of the respective points of intersection. Thus, it takes a long time, and detection is not accomplished in a short period of time.

In recent years, furthermore, there has been a tendency toward a decreased pad size as a result of an increase in the number of wires, i.e., an increase in the number of pins. As a result, balls are formed so as to completely cover the pads. In such cases, erroneous detection of the ball edges may occur not only when the center of a ball is greatly shifted from the center of the pad but also even when the center of the ball substantially coincides with the center of the pad. Thus, as in the case described before, the center coordinates of the ball are not calculated accurately.

SUMMARY OF THE INVENTION

The object of the present invention is to provide a ball detection method and apparatus for wire-bonded parts which is capable of detecting the balls of wire-bonded parts accurately and in a short period of time.

The object of the present invention is accomplished by a unique step taken in a method of detecting the ball of a wire-bonded part after wire bonding, and the unique step is that the edges of the ball are detected from at least three different directions which are along lines obtained by connecting a single pre-taught teaching point (which indicates a point on which a bonding is performed) and a plurality of points which are inside the pad but outside the ball, and then the position, size and/or shape of the ball are calculated based upon such three detected edges.

The object of the present invention is accomplished by another unique step used in the detecting method described above, and the unique step is that the detection frame of an imaging device which takes images of the wire-bonded parts is set so as to be larger than a predetermined ball size which falls within the image of the pad to which the ball that is to be detected is bonded, and the three directions in which the detections are executed are three of four directions which are at an angle of 45° relative to the sides of the detection frame and at an angle of 90° with each other.

The object of the present invention is accomplished by a still another unique step used in the first and second methods described above, and the unique step includes that the first and second directions of the three directions are set to be along a single straight line, and the third direction is set to be a direction that crosses at an angle of 90° the first and second directions, the ball detection is executed so that first, second and third ball edges are detected in the three directions, and then the ball is detected by determining an equal point on the bisecting line of the first and second edges from either the first edge coordinates or the second edge coordinates, and the third edge coordinates.

The object of the present invention is accomplished by a unique structure for a bonding apparatus which detects the ball formed at a wire-bonded part after wire bonding is accomplished by taking images of the wire-bonded parts with an imaging device, and the unique structure includes a detection frame setter which sets the detection frame of the imaging device so that the detection frame is larger than the ball within the image of the pad to which the ball is bonded, a control memory which sets three directions in which the edges of the ball within the detection frame is clearly discriminated, such directions being set from a pre-taught teaching point which indicates the part to be wire-bonded at the time of wire bonding, and an operation controller which detects the edges of the ball in the three directions so as to calculate the position of the ball from the three edges of the ball.

With the method and apparatus of the present invention as described above, the imaging device, which is a component of the bonding apparatus, is moved to a pre-taught teaching point on which a bonding has been executed, and the image of the bonded ball is taken by the imaging device. Then, the edges of the ball are detected in at least three directions that are along lines which connects the teaching point and points which are located inside the pad but outside the ball, and the position of the ball is obtained based upon these three ball edges. By additionally detecting four or more ball edges, the size and shape of the ball are also obtained.

DETAILED DESCRIPTION OF THE INVENTION

Figure 1:
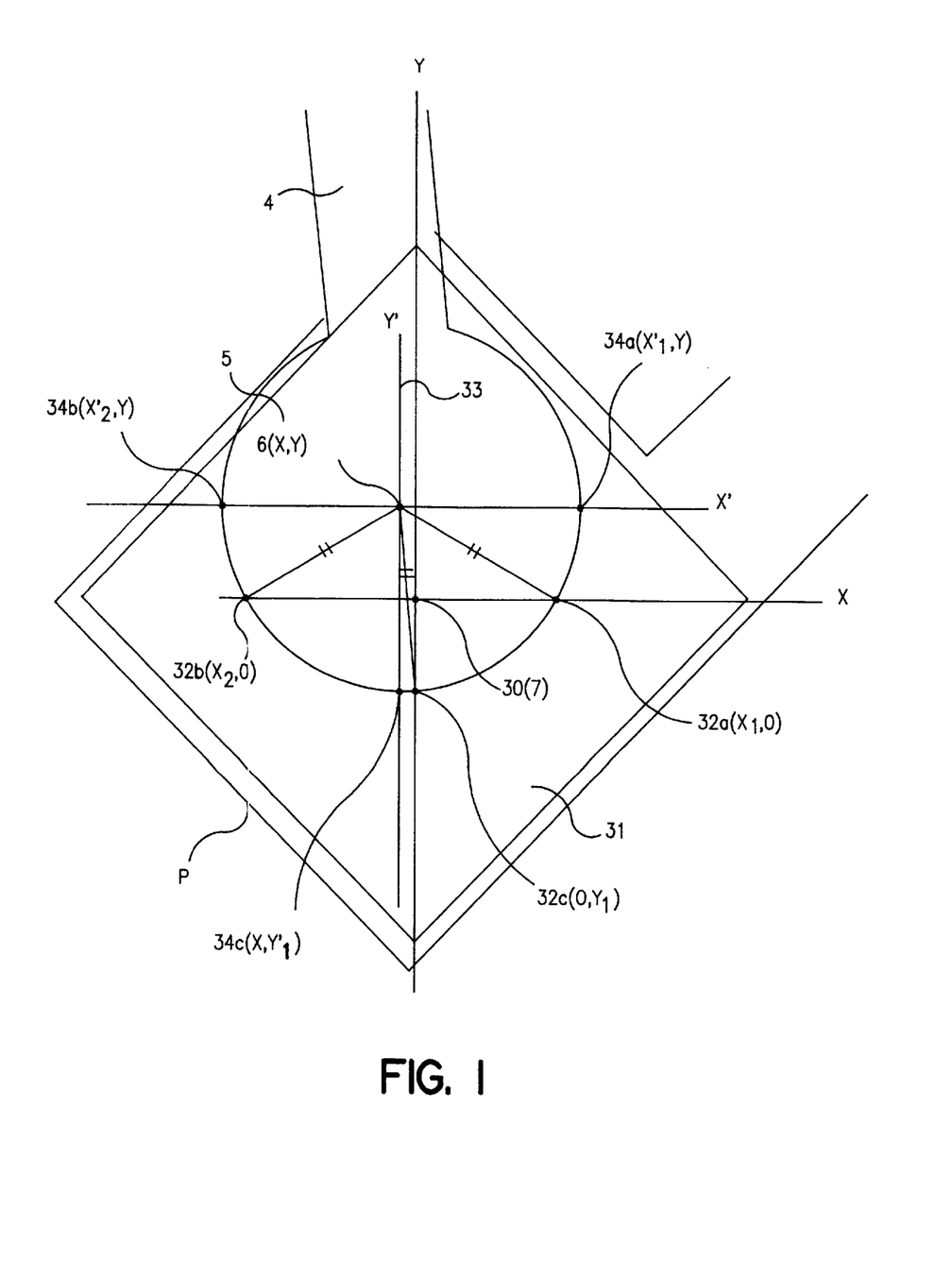
FIG. 1 is an explanatory diagram which illustrates one embodiment of the method of the present invention for detecting the center position of a wire-bonded part.

One embodiment of the present invention will be described with reference to FIGS. 1, 3 and 4. FIG. 1 shows what is shown in FIG. 6 rotated 45° in order to facilitate description.

The illuminating optical system of the image processor is set so that the ball 5 and wire 4 appear dark, and the pad P appears bright. After wire bonding is executed to the workpiece 3, the central axis 11a of an imaging device 11 is moved to a teaching point 30, which is a pre-taught bonding position that is an area where the bonding is to be performed. Ordinarily, the teaching point 30 is the center position of the pad P. In other words, the center of the detection frame 31 of the imaging device 11 is the teaching point 30. Furthermore, the size of the detection frame 31 is set so that it is larger than the ball 5 inside the image of the pad P.

In the preferred embodiment, an XY coordinate system is envisioned in which the diagonals of a square shape of the detection frame 31 are the respective coordinate axes. The teaching point 30 is taken as the origin of this coordinate system. By executing image processing, the edges of the image within the detection frame 31 are sought and detected along the respective X and Y axes. However, the direction in which the wire 4 is present is excluded because there is a danger that the edge of the ball 5 cannot be detected in such a direction. This can be accomplished by ascertaining the direction which is closest to the wire direction beforehand based on the bonding procedure of the wire bonding apparatus 10, thus excluding such a direction.

Thus, with the direction of the wire 4 excluded, the edge coordinates 32a ($X_1$, 0), 32b ($X_2$, 0) and 32c (0, $Y_1$) of the ball 5 are detected along the respective X and Y axes. In this case, the edge coordinates 32a, 32b and 32c may be detected outwardly from the teaching point 30 or inwardly toward the teaching point 30 from the edges of the detection frame 31. In either case, the dark areas closest to the detection frame 31 are taken as the edge coordinates 32a, 32b and 32c.

When (the circumference of) the ball 5 is round, the center coordinates 6 (X, Y) of the ball 5 lie on the bisecting line 33 that connects the edges 32a and 32b, and the X coordinate (component) of the ball 5 is determined as shown in Equation 1.

$$X=(X_1-X_2)/2 \qquad \text{Equation 1}$$

Furthermore, the line segments 32a-6, 32b-6 and 32c-6 are equal and correspond to the radius of the ball 5. As a result, the conditions under which one of the line segments 32a-6 or 32b-6 and the line segment 32c-6 are equal are in the case that can be shown as Equation 2. If the Equation 2 is rearranged so as to seek the Y coordinate of the center coordinates 6 of the ball 5, Equation 3 is obtained. Equation 4 is then obtained by substituting the X coordinate (component) of Equation 1 into Equation 3.

$$(X_1-X)^2+Y^2=X^2+(Y-Y_1)^2 \qquad \text{Equation 2}$$

$$Y=(Y_1^2-X_1^2+2X_1 \cdot X)/2Y_1 \qquad \text{Equation 3}$$

$$Y=(Y_1^2-X_1 \cdot X_2)/2Y_1 \qquad \text{Equation 4}$$

As seen from above, the X and Y coordinates of the center coordinates 6 of the ball 5 are expressed by Equation 1 and Equation 4. In other words, the center coordinates 6 are as shown in Equation 5.

$$X=(X_1-X_2)/2$$

$$Y=(Y_1^2-X_1 \cdot X_2)/2Y_1 \qquad \text{Equation 5}$$

In other words, two axial lines (X axis and Y axis) are set so that they are at an angle of 45° with respect to the sides of the square shape image detection frame 31 and that they are at an angle of 90° with respect to each other. In other words, the X and Y axis lines form diagonals of the square frame 31. Then, first and second edge coordinates 32a and 32b are detected on one axis (i.e., the X-axis line) which is away from the wire 4; and one set of coordinates, i.e., the third edge coordinates 32c which are also away from the wire 4, are detected on the other axis (i.e., the Y-axis line). Furthermore, an equal point on the bisecting line 33 (which is perpendicular to and extends from a middle point of a straight line between the first and second edges 32a and 32b) is obtained from either the first or second edge coordinates 32a or 32b and from the third edge coordinates 32c. The thus obtained point is the center coordinates 6 of the ball 5.

As seen from the above, the edges 32a, 32b and 32c of the ball 5, which are on the diagonals of the square image detection frame 31, are detected. Accordingly, the detected edges can be clearly distinguished even in cases where those edges of the ball 5 are very close to or overlap with the edges of the pad P. Furthermore, since the outermost dark areas within the image detection frame 31 are taken as the edges 32a, 32b and 32c, the edges 32a, 32b and 32c can be detected reliably. Moreover, the center 6 of the ball 5 is calculated using these edges 32a, 32b and 32c. Accordingly, since these edges of the ball is clear and distinctive, the center 6 can be accurately calculated, and detection can be accomplished in a short period of time.

Though it is most desirable to use the diagonals of the image detection frame 31 as two coordinate axes as in the embodiment described above, the present invention is not limited to this system. In other words, as long as three directions, i.e., two directions on a single straight line that connects points inside the pad P but outside the ball 5, and one direction perpendicular to these two directions, are both used, the edges of the ball can be detected in a short period of time, and the center coordinates 6 are easily calculated. Moreover, the size and shape of the ball 5 can be calculated by detecting if four or more ball edges.

The center coordinates 6 of the ball 5 can be detected by using the method described above; however, in some cases, the ball 5 has the shape of a deformed circle. Even in such cases, it is possible to know the shape of the ball 5 by seeking the edges in three (or more) directions from the center coordinates 6 of the ball 5 and then comparing the distances from the center coordinates 6 to the edges in the three (or more) directions.

In this case, the three directions to be selected for use are directions other than the directions that are obtained by connecting the center coordinates 6 with the ball edges 32a, 32b and 32c. For instance, the lengths $X_1'$–X, X–$X_2'$ and Y–$Y_1'$ of line segments 6-34a, 6-34b and 6-34c are obtained from edge coordinates 34a ($X_1'$, Y), 34b ($X_2'$, Y) and 34c (X, Y') of the axial line X' which passes through the center coordinates 6 and is parallel to the X-axis. Since the lengths of these line segments correspond to the radius of the ball 5, the shape of the ball 5 can be determined based upon the differences in the lengths of the three line segments. Here, the values of X and Y are as shown in the Equation 5. Furthermore, it is sufficient if the number of directions from the center coordinates 6 in which the edges of the ball 5 are detected is at least three. However, it goes without saying that the more the number of detection directions is, the more accurately the shape of the ball 5 can be ascertained.

Figure 2:
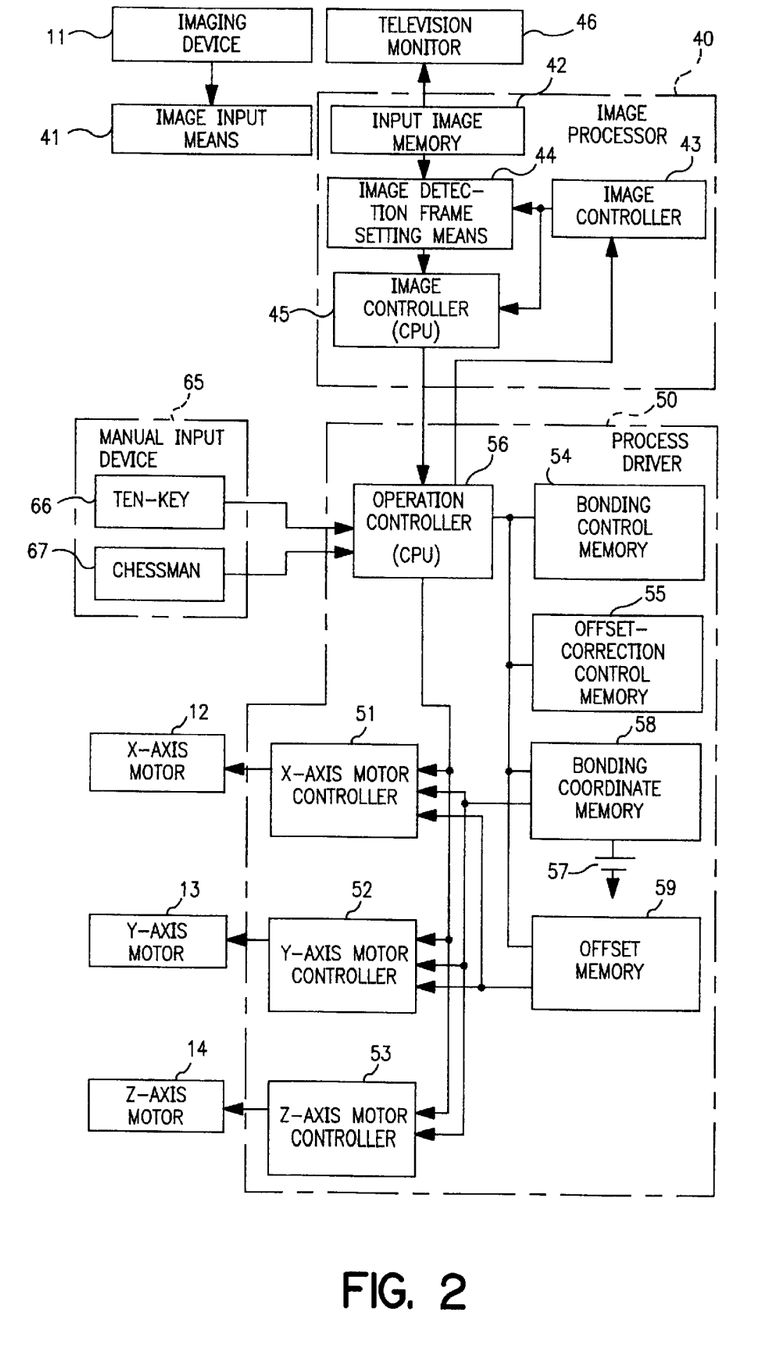
FIG. 2 is a block diagram which illustrates one embodiment of the device of the present invention for detecting the center position of a wire-bonded part.

FIG. 2 shows one embodiment of a control device which performs the method for detecting the center of a wire-bonded part described above. This control device includes mainly an image processor 40 which processes the images obtained by the imaging device 11, a process driver 50 which drives the wire bonding apparatus 10 shown in FIG. 4, and a manual input device 65 which allows data such as coordinates, etc., to be inputted into the process driver 50 manually.

The image processor 40 includes an input image memory 42 which stores image forms inputted by the imaging device 11 via an image input means 41, a control memory 43 which stores image processing steps for the input image memory 42, an image detection frame setting means 44 which sets the image detection frame 31, and an image controller 45. The image controller 45 detects the edge coordinates $32a$ ($X_1$, 0) $32b$ ($X_2$, 0) and $32c$ (0, $Y_1$) of the ball 5 by processing the images from the input image memory 42 based upon the steps stored in the control memory 43. In addition, the image controller 45 calculates the center coordinates 6 of the ball 5 according to the Equation 5. The images stored in the input image memory 42 are displayed on a television monitor 46.

The process driver 50 includes an X-axis motor controller 51, a Y-axis motor controller 52 and a z-axis motor controller 53 which control an X-axis motor 12, Y-axis motor 13 and Z-axis motor 14, respectively, and a bonding control memory 54 which stores control procedures that control the motors 12, 13 and 14 for the purpose of bonding operations as well as procedures for calculating the bonding coordinates.

The process driver 50 further includes an offset-correction control memory 55 which stores correction times and correction procedures for the offset value W which is set between the central axis $11a$ of the imaging device 11 and the central axis $15a$ of the capillary 15 shown in FIG. 4.

An operation controller 56 is also a component of the process driver 50. The operation controller 56 controls the X-axis motor controller 51, Y-axis motor controller 52, Z-axis motor controller 53, bonding control memory 54 and offset-correction control memory 55; and it also calculates actual bonding coordinates and offset correction amounts based on center shift values calculated by the image controller 45 and bonding coordinate data inputted via the manual input device 65.

A bonding coordinate memory 58 of the process driver 50 is backed-up by a battery 57 and stores the bonding coordinates calculated by the operation controller 56. An offset memory 59 which stores the corrected offset is also a component of the process driver 50. In addition, the operation controller 56 reads the bonding coordinates from the bonding coordinate memory 58 and inputs the coordinates into the image detection frame setter 44 of the image processor 40.

The manual input device 45 is either a ten-key 66 or a chessman 67. Bonding coordinates and offset values are inputted into the process driver 50 using either one of these devices.

The method for detecting the center position of a wire-bonded part using this device will be described below.

First, as described in the Prior Art section above, wire bonding is performed on a workpiece 3 as shown in FIG. 3 by means of the wire bonding apparatus 10 that is shown in FIG. 4.

After the bonding to the workpiece 3 has been completed, the operation controller 56 reads out the coordinates for a pad P (e.g., $P_1$) stored in the bonding coordinate memory 58 and the offset distance W stored in the offset memory 59 in accordance with the offset-correction control memory 55.

Then, the operation controller 56 controls the X-axis motor controller 51 and Y-axis motor controller 52 so that they comply with the coordinates which is obtained by adding the offset value W to the coordinates of the pad P. The X-axis motor 12 and Y-axis motor 13 are driven accordingly so that the central axis $11a$ of the imaging device 11 is moved to a position above the teaching point 30 (or the center 7) of the wire-bonded pad P, and the images of the pad P and ball 5 are taken by the imaging device 11. The image thus obtained is converted into a digital signal by the image input means 41 and stored in the input image memory 42.

Furthermore, the operation controller 56 of the process driver 50 reads out the coordinates of the pad P from the bonding coordinate memory 58 and inputs the coordinates into the image detection frame setter 44 via the control memory 43. The image detection frame setter 44 then sets the image detection frame 31 so that the image detection frame 31 is larger than the size of the ball 5 within the image of the pad P. FIG. 1 shows an example of the image of the ball 5 wire-bonded to the pad P that is displayed on the television monitor 46.

Next, the image controller 45 detects the edge coordinates $32a$ ($X_1$, 0), $32b$ ($X_2$, 0) and $32c$ (0, $Y_1$) of the ball 5 using the diagonals of the square image detection frame 31 as an XY coordinate system (or XY axis lines) and calculates the center coordinates 6 (X, Y) of the ball 5 according to Equation 5. Here, the XY coordinate system shown in FIG. 1 is rotated 45° degrees to the right so as to facilitate description; accordingly, the center coordinates 6 (X, Y) are rotated 45° to the left, thus producing the transformed coordinates 6 (Xs, Ys). As a result, this coordinate system coincides with the coordinate system of the image processor 40 and process driver 50. Accordingly, if the coordinates of the teaching point 30 are designated as (xs, ys), the respective amounts of shift $\Delta x$ and $\Delta y$ of the center 6 of the ball 5 from the teaching point 30 are obtained from Equation 6. Since the positional relationship between the imaging device and the bonding center is inherently offset, $\Delta x$ and $\Delta y$ are the amounts of shift in the offset at that point in time. Since the original positional relationship between the center of the camera image and the bonding center is equivalent to the offset, $\Delta x$ and $\Delta y$ are the amounts of shift in the offset at that point in time.

$$\Delta x = xs - Xs$$
$$\Delta y = ys - Ys \qquad \text{Equation 6}$$

These calculated shift values $\Delta x$ and $\Delta y$ can be detected with sub-pixel calculations, it is known that points having a maximum correlation value can be found with sub-pixel precision by using HILL-CLIMB and interpolation techniques, etc., in addition to a multi-value (graded image) correlation treatment. Furthermore, these shift amounts $\Delta x$ and $\Delta y$ are determined as numbers of pixels in the input image memory 42. However, the actual dimensions per pixel (amounts of movement of the XY table 16) depend on the magnification of the imaging device 11, and are therefore peculiar to the apparatus used. Accordingly, these values can be converted into amounts of movement of the XY table. If the constants used for this conversion are kx and ky, the actual dimensional shifts dx and dy can be calculated using Equation 7.

$$dx = kx \cdot \Delta x$$
$$dy = ky \cdot \Delta y \qquad \text{Equation 7}$$

Next, the operation controller 56 performs a correction by adding the offset value $\Delta x$ and $\Delta y$ to the X-axis component Xw and Y-axis component Yw of the offset W stored in the offset memory 59 (as shown in Equation 8) and stores these new offset components $Xw_1$ and $Yw_1$ in the offset memory 59. Subsequently, the offset components $Xw_1$ and $Yw_1$ are used until the next offset correction is performed.

$$Xw_1 = Xw + dx$$

$$Yw_1 = Yw + dy \qquad \text{Equation 8}$$

As seen from the above, in the present invention, the edges of the ball are detected from at least three directions that are obtained by connecting a pre-taught teaching point (which indicates the part to be wire-bonded at the time of wire bonding) to points inside the pad but outside the ball; and the position, size and/or shape of the ball are calculated from these detected edges. Accordingly, balls at wire-bonded points are reliably detected in a short period of time. Positional shifts of the ball can be also detected, and shifts in the amount of offset are automatically corrected. As a result, the positional precision of bonding can be improved, and fluctuations in the offset over time can be corrected.

We claim:

1. A ball detection method for wire bonded parts comprising the steps detecting three points on a periphery of a wire bonded ball is three directions from a center of a bonding pad said three directions excluding a direction of said bonding wire and calculating a center, size and shape of said wire bonded ball from said three points, and further comprising the steps of using said center of said bonding pad as a center of an XY coordinate system and calculating said center of said ball from the formulae:

$$X_c = (X_1 - X_2)/2$$

$$Y_c = (Y_1^2 - X_1 \cdot X_2)/2Y_1$$

wherein $X_c$ and $Y_c$ are coordinates of said center of said ball, $X_1$ and $X_2$ are X coordinates of two of said three points and $Y_1$ is a Y coordinate of a third of said three points.

2. A ball detection method for detecting a ball formed of a bonding pad of a semiconductor chip during wire bonding between a lead of a lead frame and bonding pad of a semiconductor chip, said method comprising detecting three points on a periphery of said ball located in three directions from a point of center coordinates of said bonding pad, said three directions excluding a direction of said lead and a center of said ball from said three points, and further comprising the steps of using said center of said bonding pad as a center of an XY coordinate system and calculating said center of said ball from the formulae:

$$X_c = (X_1 - X_2)/2$$

$$Y_c = (Y_1^2 - X_1 \cdot X_2)/2Y_1$$

wherein $X_c$ and $Y_c$ are coordinates of said center of said ball, $X_1$ and $X_2$ are X coordinates of two of said three points and $Y_1$ is a Y coordinate of a third of said three points.

3. A ball detection method for detecting a ball formed during a wire bonding process of a workpiece comprising determining coordinates of three points on a periphery of a wire ball in three directions from a center of a bonding pad, said three directions excluding a direction of said bonding wire and calculating at least one of center, size and shape of said ball based upon coordinates of said three points, and further comprising the steps of using said center of said bonding pad as a center of an XY coordinate system and calculating said center of said ball from the formula:

$$X_c = (X_1 - X_2)/2$$

$$Y_c = (Y_1^2 - X_1 \cdot X_2)/2Y_1$$

wherein $X_c$ ad $Y_c$ are coordinates of said center of said ball, $X_1$ and $X_2$ are X coordinates of two of said three points and $Y_1$ is a Y coordinate of a third of said three points.

* * * * *